(12) United States Patent
Hao et al.

(10) Patent No.: US 11,614,494 B2
(45) Date of Patent: Mar. 28, 2023

(54) METHOD, APPARATUS, DEVICE AND MEDIUM FOR DETECTING INTERNAL SHORT-CIRCUIT FAULT OF BATTERY CELL

(71) Applicant: Contemporary Amperex Technology Co., Limited, Ningde (CN)

(72) Inventors: Yucang Hao, Ningde (CN); Xiaobo Chen, Ningde (CN); Ting Li, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/566,694

(22) Filed: Dec. 31, 2021

(65) Prior Publication Data

US 2022/0196748 A1 Jun. 23, 2022

Related U.S. Application Data

(63) Continuation of application No. PCT/CN2021/081241, filed on Mar. 17, 2021.

(30) Foreign Application Priority Data

Jun. 30, 2020 (CN) .......................... 202010616755.X

(51) Int. Cl.
*G01R 31/385* (2019.01)
*H01M 10/42* (2006.01)

(52) U.S. Cl.
CPC ...... *G01R 31/385* (2019.01); *H01M 10/4285* (2013.01)

(58) Field of Classification Search
CPC .............. H01M 10/4285; H01M 10/04; G01R 31/392; G01R 31/3858; G01R 31/3644; G01L 9/0002

(Continued)

(56) References Cited

U.S. PATENT DOCUMENTS

| 2018/0328998 A1 | 11/2018 | Zhang et al. |
| 2019/0181663 A1 | 6/2019 | Nishikawa et al. |
| 2019/0353693 A1* | 11/2019 | Yang ..................... H01M 10/48 |

FOREIGN PATENT DOCUMENTS

| CN | 103163464 A | 6/2013 |
| CN | 103545564 A | 1/2014 |

(Continued)

OTHER PUBLICATIONS

China National Intellectual Property Administration, Office Action for the application No. 202010616755.X, dated Jun. 10, 2022, 8 pages.

(Continued)

*Primary Examiner* — Lee E Rodak
*Assistant Examiner* — Trung Q Nguyen
(74) *Attorney, Agent, or Firm* — Haverstock & Owens, A Law Corporation

(57) ABSTRACT

The application provides a method, apparatus, device and medium for detecting an internal short-circuit fault of a battery cell. The method includes obtaining electrical signal values for each of m battery cells of a battery pack, when it is in a preset condition including that a current detection is an $n^{th}$ detection; performing following steps for a target battery cell: calculating a first parameter of the target battery cell using the electrical signal values of the target battery cell, which characterizes a degree of fluctuation of the electrical signal values; calculating a second parameter that characterizes a degree of dispersion between the first parameter of the target battery cell and first parameters of other battery cells; and determining that an internal short-circuit fault occurs in the target battery cell, under a condition that the second parameter is greater than a threshold.

15 Claims, 6 Drawing Sheets

(58) Field of Classification Search
USPC .................................................. 324/425–435
See application file for complete search history.

(56) References Cited

FOREIGN PATENT DOCUMENTS

| | | | |
|---|---|---|---|
| CN | 104617330 | A | 5/2015 |
| CN | 106932722 | A | 7/2017 |
| CN | 107831443 | A | 3/2018 |
| CN | 109709485 | A | 5/2019 |
| CN | 110376530 | A | 10/2019 |
| CN | 110687457 | A | 1/2020 |
| CN | 110764014 | A | 2/2020 |
| JP | 2003282156 | A | 10/2003 |
| JP | 2010231939 | A | 10/2010 |
| JP | 2022545033 | A | 10/2022 |
| WO | 2017114195 | A1 | 7/2017 |
| WO | 2017130258 | A1 | 8/2017 |

OTHER PUBLICATIONS

The Chinese Office Action dated Oct. 12, 2022 for Chinese Application No. 202010616755.X, 7 pages.
The Extended European Search Report dated Aug. 5, 2022 for European Patent Application No. 21800970.2, 6 pages.
Japanese Office Action dated Jan. 23, 2023 for Japanese Patent Application No. 2022-542954, 14 pages.

* cited by examiner

METHOD, APPARATUS, DEVICE AND MEDIUM FOR DETECTING INTERNAL SHORT-CIRCUIT FAULT OF BATTERY CELL

CROSS-REFERENCE TO RELATED APPLICATIONS

This application is a continuation of International application No. PCT/CN2021/081241, filed on Mar. 17, 2021, which claims the priority to Chinese patent application No. 202010616755.X, filed on Jun. 30, 2020, both of which are hereby incorporated by reference in their entireties.

TECHNICAL FIELD

This application relates to the field of, and particularly to a method, apparatus, device and medium for detecting an internal short-circuit fault of a battery cell.

BACKGROUND

With the development of new energy, more and more fields use new energy as power. Due to advantages of high energy density, recyclable charging, safety and environmental protection etc., battery packs are widely used in fields of new energy automobiles, consumer electronics, energy storage systems and the like.

However, in recent years, with the popularization and application of battery packs, accidents caused by internal short-circuit of battery cells have occurred from time to time, such as thermal runaway accidents caused by sudden rise in battery temperature, smoke, fire or even explosion, which has seriously affected the market's acceptance of battery packs.

However, it takes several hours from occurrence of internal short-circuit in a battery cell to an eventual safety accident. Therefore, how to detect the internal short-circuit as early as possible within the several hours is significant to the safety of battery packs.

SUMMARY

Embodiments of the present application provide a method, apparatus, device and medium for detecting an internal short-circuit fault of a battery cell, which can detect accurately a battery cell inside which short-circuit occurs.

In a first aspect, a method for detecting an internal short-circuit fault of a battery cell is provided. The method includes:

obtaining electrical signal values at multiple times for each of m battery cells of a battery pack, when the battery pack is in a preset condition, wherein the preset condition comprises that a current detection is an $n^{th}$ detection of an internal short-circuit fault of a battery cell, and m and n are positive integers; and performing following steps for a target battery cell of the battery pack:

calculating a first parameter of the target battery cell using the electrical signal values at the multiple times of the target battery cell, wherein the first parameter is used to characterize a degree of fluctuation of the electrical signal values of the target battery cell;

calculating a second parameter that characterizes a degree of dispersion between the first parameter of the target battery cell and first parameters of other battery cells, wherein the other cells are battery cells of the m battery cells other than the target battery cell, and the second parameter has a positive correlation with the degree of dispersion; and determining that an internal short-circuit fault occurs in the target battery cell, under a condition that the second parameter is greater than a preset parameter threshold.

According to the method for detecting the internal short-circuit fault of the battery cell in the embodiment of the present application, in the current $n^{th}$ detection process for the internal short-circuit fault of the battery cell under the charging/discharging operating condition, the first parameter can be calculated according to the electrical signal values at the multiple times of the target battery cell. For m battery cells of the same battery pack, a change rate of an electrical signal of a faulty battery cell in which an internal short-circuit fault occurs will differ from a change rate of an electrical signal of a normal battery cell, and correspondingly a degree of fluctuation of the electrical signal of the faulty battery cell will also differ from that of the normal battery cell. Since the first parameter can characterize the degree of fluctuation of the electrical signal, the first parameter of the faulty battery cell is also different from that of the normal battery cell. When there is a faulty battery cell in the m battery cells of the battery pack, the degree of dispersion between the first parameter of the faulty battery cell and the first parameters of other battery cells will be greater than that of a normal battery cell. Therefore, the second parameter characterizing the degree of dispersion between the first parameter of each battery cell and the first parameters of the other battery cells is used. Since the second parameter has a positive correlation with the degree of dispersion, a battery cell in which an internal short-circuit occurs can be detected accurately, when the second parameter of the battery cell is greater than the preset parameter threshold.

In some implementations, when n is an integer greater than 1, the preset condition further includes that the second parameter of the target battery cell is greater than the preset parameter threshold, for each of first n−1 detections of the internal short-circuit fault of the battery cell In these implementations, it can be detected whether the internal short-circuit fault has occurred in the battery pack according to second parameters of the first n detection processes, so as to avoid influences of accidental factors on the accuracy of the internal short-circuit fault, and improve the accuracy of the detection of the internal short-circuit fault of the battery cell.

In some implementations, the preset parameter threshold has a positive correlation with a quantity of the m battery cells.

In these implementations, a relationship between the total quantity of the battery cells and the preset parameter threshold can be taken into consideration, so as to improve the accuracy of the detection of the internal short-circuit fault of the battery cell.

In some implementations, the first parameter of the target battery cell is a standard deviation of the electrical signal values at the multiple times of the target battery cell.

In these implementations, by taking the standard deviation of the electrical signal values at multiple times of the target battery cell as the first parameter of the target battery cell, the value of the standard deviation can accurately reflect the degree of fluctuation of the electrical signal values at multiple times of the target battery cell, so as to further improve the accuracy of the detection of the internal short-circuit fault of the battery cell.

In some implementations, the second parameter is a coefficient of variation, and calculating the second parameter that characterizes the degree of dispersion between the first parameter of the target battery cell and the first parameter of other battery cells includes specifically:

calculating a target standard deviation characterizing a degree of dispersion of first parameters of the m battery cells, and calculating an average of the first parameters of the m battery cells; and calculating a ratio of a target difference to the target standard deviation, and determining the ratio as the coefficient of variation of the target battery cell, wherein the target difference is a difference between the first parameter of the target battery cell and the average.

In these implementations, by using the dimensionless coefficient of variation as the second parameter, the second parameters during different time periods in the charging/discharging process can be unified, and it is thus convenient to unify discrimination standards used in the different time periods to determine whether the internal short-circuit fault occurs in the target battery cell.

In a second aspect, an apparatus for detecting an internal short-circuit fault of a battery cell is provided. The apparatus includes:

a data obtaining module, configured to obtain electrical signal values at multiple times for each of m battery cells of a battery pack, when the battery pack is in a preset condition, wherein the preset condition comprises that a current detection is an $n^{th}$ detection of an internal short-circuit fault of a battery cell, and m and n are positive integers;

a first calculation module, configured to calculate, for a target battery cell of the battery pack, a first parameter of the target battery cell using the electrical signal values at the multiple times of the target battery cell, wherein the first parameter is used to characterize a degree of fluctuation of the electrical signal values of the target battery cell;

a second calculation module, configured to calculate, for the target battery cell of the battery pack, a second parameter that characterizes a degree of dispersion between the first parameter of the target battery cell and first parameters of other battery cells, wherein the second parameter has a positive correlation with the degree of dispersion, and the other cells are battery cells of the m battery cells other than the target battery cell; and a fault detection module, configured to determine, for the target battery cell of the battery pack, that an internal short-circuit fault occurs in the target battery cell, under a condition that the second parameter is greater than a preset parameter threshold.

According to the apparatus for detecting the internal short-circuit fault of the battery cell in the embodiment of the present application, in the current $n^{th}$ detection process for the internal short-circuit fault of the battery cell under the charging/discharging operating condition, the first parameter can be calculated according to the electrical signal values at the multiple times of the target battery cell. For m battery cells of the same battery pack, a change rate of an electrical signal of a faulty battery cell in which an internal short-circuit fault occurs will differ from a change rate of an electrical signal of a normal battery cell, and correspondingly a degree of fluctuation of the electrical signal of the faulty battery cell will also differ from that of the normal battery cell. Since the first parameter can characterize the degree of fluctuation of the electrical signal, the first parameter of the faulty battery cell is also different from that of the normal battery cell. When there is a faulty battery cell in the m battery cells of the battery pack, the degree of dispersion between the first parameter of the faulty battery cell and the first parameters of other battery cells will be greater than that of a normal battery cell. Therefore, the second parameter characterizing the degree of dispersion between the first parameter of each battery cell and the first parameters of the other battery cells is used. Since the second parameter has a positive correlation with the degree of dispersion, a battery cell in which an internal short-circuit occurs can be detected accurately, when the second parameter of the battery cell is greater than the preset parameter threshold.

In some implementations, when n is an integer greater than 1, the preset condition further includes that the second parameter of the target battery cell is greater than the preset parameter threshold, for each of first n−1 detections of the internal short-circuit fault of the battery cell In these implementations, it can be detected whether the internal short-circuit fault has occurred in the battery pack according to second parameters of the first n detection processes, so as to avoid influences of accidental factors on the accuracy of the internal short-circuit fault, and improve the accuracy of the detection of the internal short-circuit fault of the battery cell.

In some implementations, the preset parameter threshold has a positive correlation with a quantity of the m battery cells.

In these implementations, a relationship between the total quantity of the battery cells and the preset parameter threshold can be taken into consideration, so as to improve the accuracy of the detection of the internal short-circuit fault of the battery cell.

In a third aspect, a device for detecting an internal short-circuit fault of a battery cell is provided. The device includes a memory, configured to store programs; and a processor, configured to execute the programs stored in the memory to perform the method for detecting the internal short-circuit fault of the battery cell provided by the first aspect or any optional implementation of the first aspect.

According to the device for detecting the internal short-circuit fault of the battery cell in the embodiment of the present application, in the current $n^{th}$ detection process for the internal short-circuit fault of the battery cell under the charging/discharging operating condition, the first parameter can be calculated according to the electrical signal values at the multiple times of the target battery cell. For m battery cells of the same battery pack, a change rate of an electrical signal of a faulty battery cell in which an internal short-circuit fault occurs will differ from a change rate of an electrical signal of a normal battery cell, and correspondingly a degree of fluctuation of the electrical signal of the faulty battery cell will also differ from that of the normal battery cell. Since the first parameter can characterize the degree of fluctuation of the electrical signal, the first parameter of the faulty battery cell is also different from that of the normal battery cell. When there is a faulty battery cell in the m battery cells of the battery pack, the degree of dispersion between the first parameter of the faulty battery cell and the first parameters of other battery cells will be greater than that of a normal battery cell. Therefore, the second parameter characterizing the degree of dispersion between the first parameter of each battery cell and the first parameters of the other battery cells is used. Since the second parameter has a positive correlation with the degree of dispersion, a battery cell in which an internal short-circuit occurs can be detected accurately, when the second parameter of the battery cell is greater than the preset parameter threshold.

In a fourth aspect, a computer storage medium is provided. The computer storage medium has computer program instructions stored thereon. The computer program instructions, when executed by a processor, cause the method for detecting the internal short-circuit fault of the battery cell provided by the first aspect or any optional implementation of the first aspect to be implemented.

According to the computer storage medium in the embodiment of the present application, in the current $n^{th}$ detection process for the internal short-circuit fault of the battery cell under the charging/discharging operating condition, the first parameter can be calculated according to the electrical signal values at the multiple times of the target battery cell. For m battery cells of the same battery pack, a change rate of an electrical signal of a faulty battery cell in which an internal short-circuit fault occurs will differ from a change rate of an electrical signal of a normal battery cell, and correspondingly a degree of fluctuation of the electrical signal of the faulty battery cell will also differ from that of the normal battery cell. Since the first parameter can characterize the degree of fluctuation of the electrical signal, the first parameter of the faulty battery cell is also different from that of the normal battery cell. When there is a faulty battery cell in the m battery cells of the battery pack, the degree of dispersion between the first parameter of the faulty battery cell and the first parameters of other battery cells will be greater than that of a normal battery cell. Therefore, the second parameter characterizing the degree of dispersion between the first parameter of each battery cell and the first parameters of the other battery cells is used. Since the second parameter has a positive correlation with the degree of dispersion, a battery cell in which an internal short-circuit occurs can be detected accurately, when the second parameter of the battery cell is greater than the preset parameter threshold.

BRIEF DESCRIPTION OF THE DRAWINGS

In order to illustrate technical solutions of embodiments of the present application more clearly, drawings necessary for the embodiments of the present application will be introduced briefly below. Obviously, the drawings described below are only some embodiments of the present application, and other drawings may be obtained from those drawings by those having ordinary skills in the art without any creative work.

Figure 1:
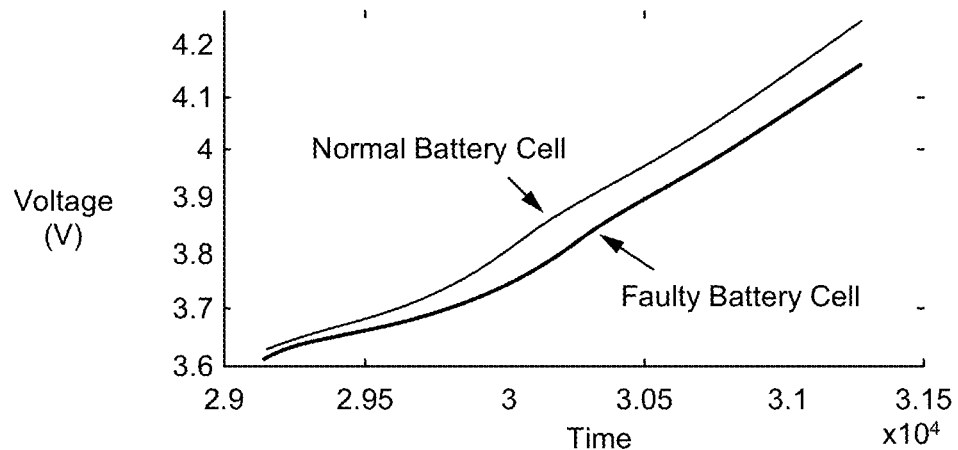
FIG. 1 is an exemplary schematic diagram showing voltages of normal battery cells and faulty battery cells changing over time during a charging process of a battery pack with a total of 30 battery cells.

In the drawings, the figures are not drawn to the actual scale.

DETAILED DESCRIPTION

Implementations of the present application will be described in further details below with reference to the drawings and embodiments. The following detailed description of the embodiments and drawings are used to illustrate principles of the present application exemplarily, instead of limiting the scope of the present application. That is, the present application is not limited to the described embodiments.

In the description of the application, it should be noted that, unless otherwise stated, "a plurality of" means two or more; the terms "top", "bottom", "left", "right", "inside", and "outside" used to indicate orientation or position relationships are only for purpose of facilitating the description of the application and simplifying the description, and do not indicate or imply that a device or element referred to must have a specific orientation, be constructed and operated in a specific orientation, and therefore cannot be understood as limitations to the application. In addition, the terms "first", "second", "third", etc. are only used for descriptive purposes, and cannot be understood as indicating or implying relative importance.

The orientation words appearing in the following description are all directions shown in the figures, and do not limit the specific structure of the application. In the description of the application, it should also be noted that, unless otherwise explicitly stated and defined, the terms "installation", "interconnection", and "connection" should be understood in a broad sense, for example, it may be a fixed connection or a detachable connection, an integral connection; it may be a direct connection or an indirect connection through an intermediate medium. For those of ordinary skills in the art, specific meanings of the above-mentioned terms in this application may be understood according to specific circumstances.

Features and exemplary embodiments of various aspects of the present application will be described in details below. In order to make objects, technical solutions and advantages of the present application clearer, the present application will be further described in details below with reference to the drawings and embodiments. It should be understood that, the specific embodiments described herein are configured to explain the present application, and not to limit the present application. For those skilled in the art, the present application can be practiced without some of those specific details. The following description of the embodiments is only for providing a better understanding of the present application by showing examples of the present application.

It is to be noted that relational terms such as first and second are used herein simply to distinguish one entity or operation from another entity or operation without necessarily requiring or implying any actual such relationship or order between such entities or operations. Moreover, terms "comprising", "including", or any other variation thereof, are intended to cover non-exclusive inclusion, such that a process, method, article or device that include a series of elements may not include only those elements but may include other elements not explicitly listed or inherent to such process, method, article or device. Without more constraints, elements preceded by "include . . . " do not preclude additional identical elements existing in the process, method, article or device that include the elements.

Embodiments of the present application provide a method, apparatus, device and medium for detecting an internal short-circuit fault of a battery cell, which can be applied to an application scenario of detecting an internal short-circuit fault of a battery cell in a battery, for example, a specific application scenario of detecting an internal short-circuit fault of a battery cell in a battery that is in a static state, a specific application scenario of detecting an internal short-circuit fault of a battery cell in a battery that is in a charging state, and a specific application scenario of detecting an internal short-circuit fault of a battery cell in a battery that is in a discharging state. Exemplarily, the battery pack in the embodiments of the present application may be a battery pack in an energy storage apparatus, or may be a battery pack in an electric vehicle.

In order to provide a better understanding of the present application, embodiments of the present application explain concepts such as internal short-circuit in details.

Internal short-circuit mainly refers to short-circuit caused by physical contact inside a battery cell. For example, the internal short-circuit may be caused by short-circuit due to diaphragm piercing by burrs of a copper foil and an aluminum foil or diaphragm piercing by dendritic crystals of lithium atoms. Since these fine needle-like metals are very thin and have a certain resistance value, a short-circuit current is not necessarily very large. However, if the internal short-circuit fault is not discovered in time, it is possible that thermal runaway accidents of sudden rise in battery temperature, smoke, fire or even explosion will be caused by the internal short-circuit, which will seriously affect the battery safety and battery life. For electric vehicles with a battery installed, if an internal short-circuit fault occurs in the battery, the market's acceptance of the electric vehicle will be affected seriously.

Therefore, there is a need for a scheme that is able to detect an internal short-circuit fault of a battery cell.

Figure 2:
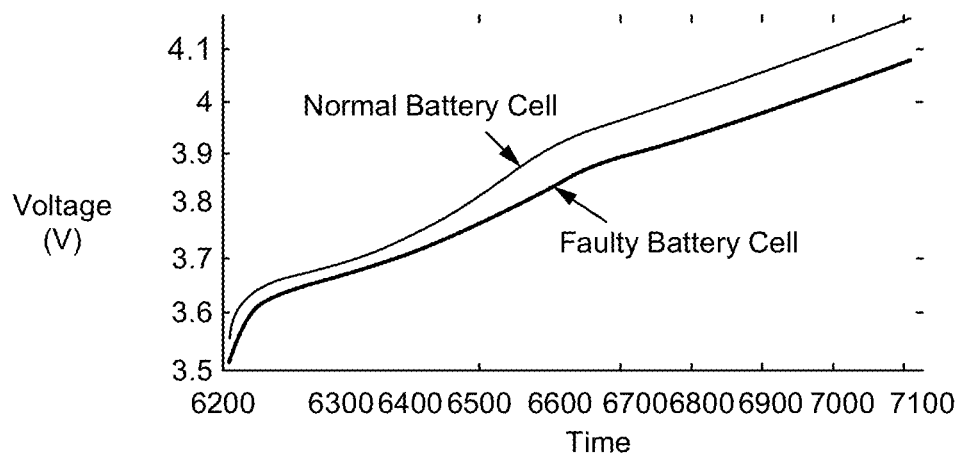
FIG. 2 is an exemplary schematic diagram showing voltages of normal battery cells and faulty battery cells changing over time during a charging process of a battery pack with a total of 192 battery cells.

The applicant has seen from a large amount of test data and simulation results that a voltage change trend of a battery cell in which an internal short-circuit fault occurs is different from that of a normal battery cell. For example, FIG. 1 is an exemplary schematic diagram showing voltages of normal battery cells and faulty battery cells changing over time during a charging process of a battery pack with a total of 30 battery cells. FIG. 2 is an exemplary schematic diagram showing voltages of normal battery cells and faulty battery cells changing over time during a charging process of a battery pack with a total of 192 battery cells.

As can be seen from FIG. 1 and FIG. 2, no matter how many battery cells are in the battery pack, for a battery cell in which an internal short-circuit fault occurs, during the charging process, its voltage remains rising for a period of time before thermal runaway happens, but the rising degree is different from that of a normal battery cell.

In light of the above findings, embodiments of the present application provide a scheme for detecting an internal short-circuit fault of a battery cell.

In order to provide better understanding of the present application, the method, apparatus, device and medium for detecting an internal short-circuit fault of a battery cell will be described in details below with reference to the accompanying drawings. It should be noted that these embodiments are not intended to limit the scope of the present disclosure.

Figure 3:
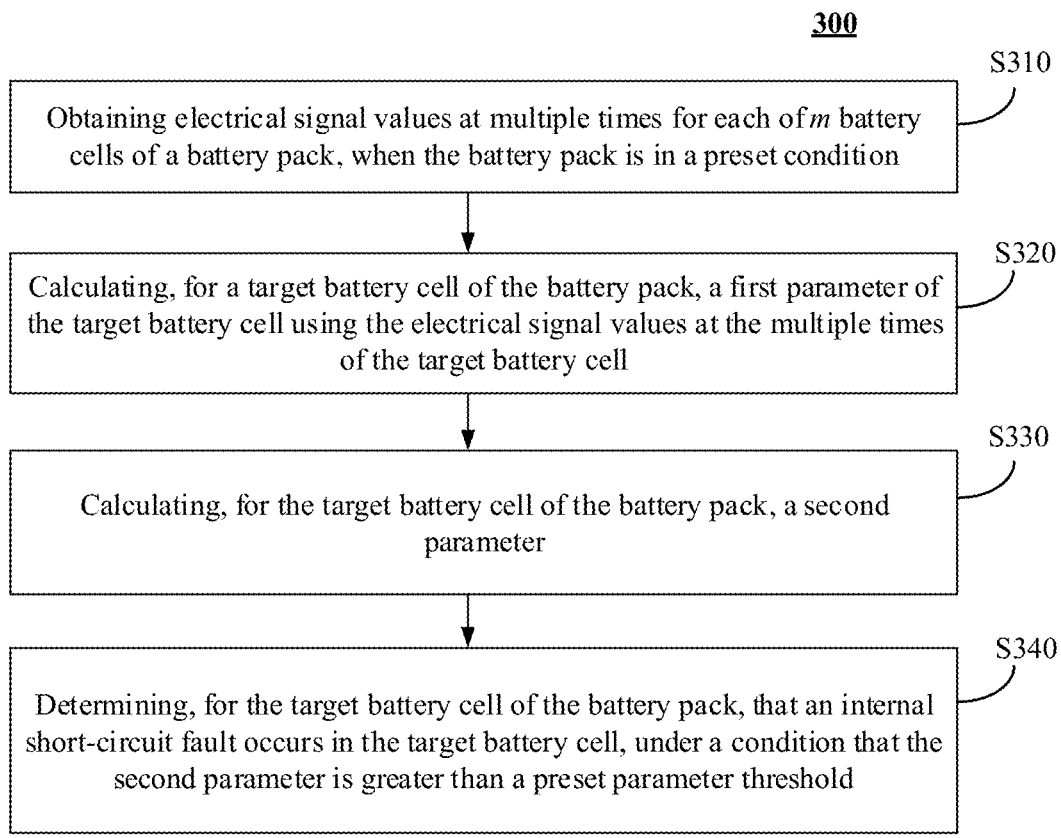
FIG. 3 is a schematic flowchart of a method for detecting an internal short-circuit fault of a battery provided by an embodiment of the present application.

FIG. 3 is a schematic flowchart of a method for detecting an internal short-circuit fault of a battery provided by an embodiment of the present application. As shown in FIG. 3, the method 300 for detecting the internal short-circuit fault of the battery of this embodiment may include following steps S310 to S340.

S310: Electrical signal values at multiple times for each of m battery cells of a battery pack are obtained, when the battery pack is in a preset condition.

Firstly, regarding the battery pack in the embodiment of the present application, the battery pack may be a battery device including m battery cells, such as a high-voltage battery pack, a low-voltage storage battery, a battery module etc., where m is a positive integer. The embodiment of the present application does not limit the specific form of the battery pack.

Secondly, regarding to the preset condition, the preset condition includes that a current detection is an $n^{th}$ detection of an internal short-circuit fault of a battery cell, where n is a positive integer. In other words, before a battery leaves the factory, or during a process that the leaves the factory and is put into use, the battery pack may be detected multiple times for internal short-circuit faults.

In some embodiments, fault detection results of the first n−1 detection processes may not be taken into consideration, it may be confirmed whether an internal short-circuit fault occurs in a target battery cell using a detection result of the $n^{th}$ detection process.

In other embodiments, in order to avoid influences of accidental factors on the accuracy of the internal short-circuit fault, the preset condition may further include that a second parameter of the target battery cell is greater than a preset parameter threshold, for each of the first n−1 detection processes of the internal short-circuit fault of the battery cell, where n is an integer greater than 1. That is to say, in the first n detection processes, a second parameter needs to be calculated in each detection process, and the second parameter calculated in each detection process needs to be greater than the preset parameter threshold.

It should be noted that the numerical value n in the embodiment of the present application may represent a relative number, and is not limited to the $n^{th}$ detection since the fault detection of the battery pack is started. The number of detections may be reset to 0 every preset time period. Alternatively, the number of detections may be reset to 0 when the second parameter is less than the preset parameter threshold in a certain detection process.

The n fault detections in the embodiments of the present application may be the fault detections when the battery pack is in a static operating condition, a charging operating condition, and a discharging operating condition. In some embodiments, the preset condition may further include that the battery pack is in a target charging/discharging operating condition. That is to say, the current detection may be the $n^{th}$ fault detection process when the battery is in a charging state or a discharging state.

In some cases, it is necessary to determine whether an internal short-circuit fault occurs in a battery cell based on a voltage difference between individual battery cells in a static operating condition, that is, when the charging current and discharging current are zero. However, the solution of judging the internal short-circuit fault by the pressure difference is not only liable to cause misdiagnosis, but also cannot identify the internal short-circuit effectively unless it is relatively severe, which shortens fault repair time severely. Further, the solution is only suitable for a specific detection scenario in which the battery in the static operating condition, and is unable to meet requirements of internal short-circuit detection in the complex charging/discharging operating condition. The detection method provided by the embodiment of the present application can detect the internal short-circuit fault of the battery cell no matter whether the battery pack is in the static operating condition, charging operating condition, or discharging operating condition. Therefore, the versatility of the detection method can be improved.

The electrical signal value is then described. The electrical signal value is a value of an electrical signal that is different between a normal battery cell and a faulty battery cell. Exemplarily, it may be a voltage value or a current value. In order to facilitate the understanding of the present application, the following part of the embodiments of the present application will mainly use the voltage value as an example for a specific explanation.

Finally, regarding S310, for each battery cell in the battery pack, electrical signal values at p times can be obtained. That is to say, m electrical signal values need to be obtained for the $i^{th}$ time of the p times, where p is an integer greater than 1, and i is any positive integer not greater than p.

S320: For the target battery cell of the battery pack, calculating a first parameter of the target battery cell using the electrical signal values at the multiple times of the target battery cell.

The target battery cell is described firstly. The target battery cell refers to a battery cell in the battery pack for which an internal short-circuit fault diagnosis should be performed. Exemplarily, during the detection process, each of the m cells may be sequentially taken as the target battery cell for which the fault detection to be performed. In other words, after the internal short-circuit fault detection for any one of the battery cells, such as the $j^{th}$ battery cell, is completed, the next battery cell, i.e., the $(j+1)^{th}$ battery cell, may be taken as the target battery cell and the internal short-circuit fault detection may be performed on the battery cell, where j+1 is a positive integer not less than m. The first parameter is described secondly. The first parameter is used to characterize a degree of fluctuation of the electrical signal values of the target battery cell. If differences between the p electrical signal values of the target battery cell are small, i.e., the degree of fluctuation of the p electrical signal values of the target battery cell is small, the first parameter is small. Conversely, if differences between the p electrical signal values of the target battery cell are large, i.e., the degree of fluctuation of the p electrical signal values of the target battery cell is large, the first parameter is large.

In some embodiments, the first parameter may be a standard deviation, an average deviation, or a variance of the battery cell values at m time instants, which is not limited herein.

In a specific embodiment, an example that the first parameter is the standard deviation is described. The standard deviation $\sigma_j$ of the target battery cell meets equation (1):

$$\sigma_j = \sqrt{\frac{1}{p}\sum_{i=1}^{p}(V_{ij})^2} \qquad (1)$$

In the equation, the target battery cell is the $j^{th}$ battery cell, j is any positive integer less than or equal to m, $V_{ij}$ is a voltage value of the $j^{th}$ battery cell at the $i^{th}$ time, and i is any positive integer less than or equal to p.

S330: For the target battery cell of the battery pack, calculating a second parameter of the target battery cell.

The second parameter of the target battery cell is described below.

The second parameter of the target battery cell is used to characterize a degree of dispersion between the first parameter of the target battery cell and first parameters of other battery cells. The other cells are battery cells of the m battery cells other than the target battery cell. Particularly, the second parameter may be a standard deviation or a coefficient of variation of the first parameters of the m battery cells. In an example, since a voltage of the battery cell gradually increases with time during the charging/discharging process, in order to facilitate unification of second parameters in different time periods, the second parameter may be a dimensionless coefficient of variation. It should be noted that a calculation method of the first parameters of the other battery cells is the same as the calculation method of the first parameter of the target battery cell, which will not be repeated here.

The second parameter has a positive correlation with the degree of dispersion. That is to say, the greater the degree of dispersion between the first parameter of the target battery cell and the first parameters of other m−1 battery cells, the greater the second parameter of the target battery cell. FIG. 1 is continued being taken as an example. As shown, change curves of normal battery cells have small differences and are mainly gathered in one area. For the target battery cell, the closer its change curve is to the gathering area of the change curves of the normal battery cells, the smaller the second parameter; on the contrary, if its change curve is farther away from the gathering area of the change curves of the normal battery cells, the second parameter is larger.

In some embodiments, if the second parameter of the target battery cell is the coefficient of variation, the coefficient of variation $B_j$ of the target battery cell meets equation (2):

$$B_j = \frac{\sigma_j - \sigma_{mean}}{\sigma_\sigma} \qquad (2)$$

In the equation, $\sigma_j$ is the first parameter of the target battery cell, $\sigma_{mean}$ is an average of the first parameters of the m battery cells, and $\sigma_\sigma$ is a target standard deviation.

Figure 4:
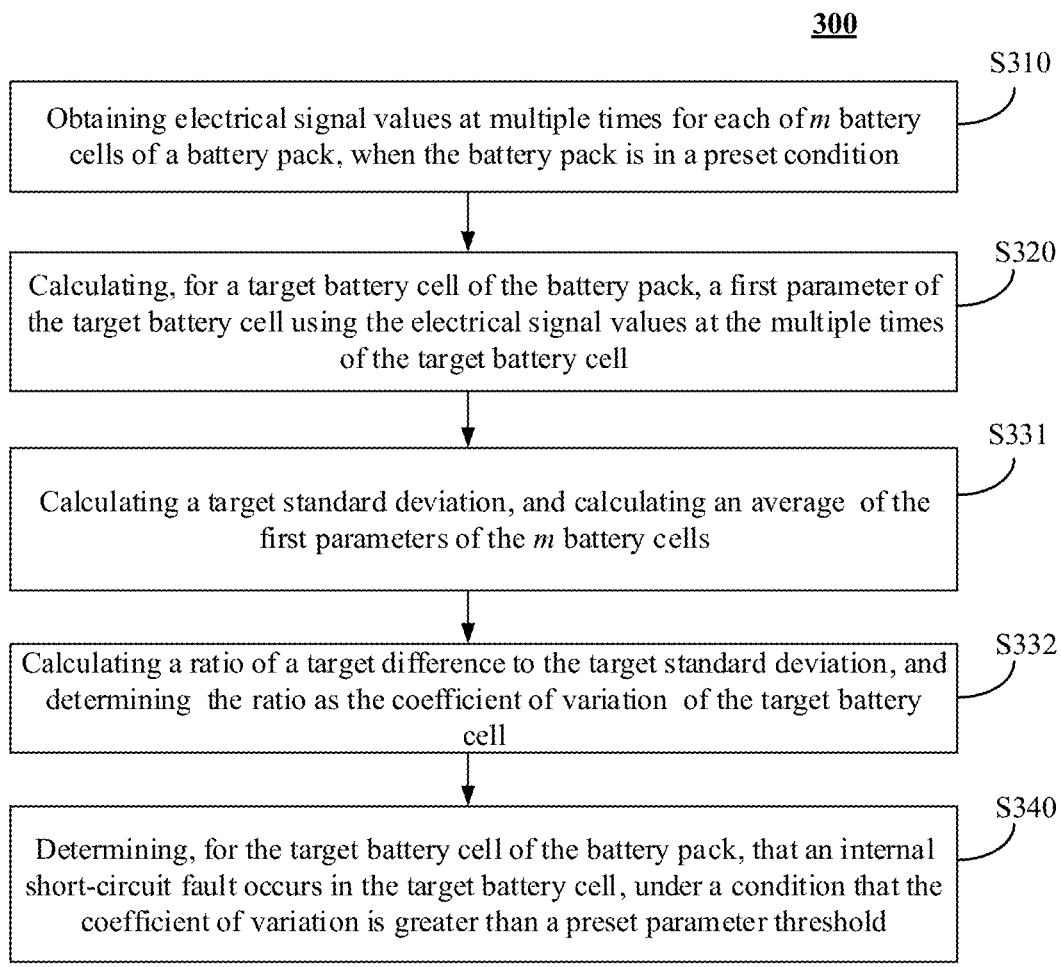
FIG. 4 is a schematic flowchart of an exemplary method for detecting an internal short-circuit fault of a battery cell provided by an embodiment of the present application.

Correspondingly, FIG. 4 is a schematic flowchart of an exemplary method for detecting an internal short-circuit fault of a battery cell provided by an embodiment of the present application. As shown in FIG. 4, a specific implementation of S330 may include steps S331 and S332.

S331: The target standard deviation $\sigma_\sigma$ is calculated, and the average $\sigma_{mean}$ of the first parameters of the m battery cells is calculated.

Among them, the target standard deviation $\sigma_\sigma$ is used to characterize the dispersion degree of the first parameters of the m battery cells, and a calculation equation of the target standard deviation $\sigma_\sigma$ is equation (3):

$$\sigma_\sigma = \sqrt{\frac{1}{m}\sum_{j=1}^{m}(\sigma_j)^2} \qquad (3)$$

Among them, a calculation equation of the average $\sigma_{mean}$ of the first parameters of the m battery cells is equation (4):

$$\sigma_{mean} = \frac{1}{m}\sum_{j=1}^{m} \sigma_j \qquad (4)$$

S332: A ratio $d/\sigma_\sigma$ of a target difference d to the target standard deviation $\sigma_\sigma$ is calculated, and is determined as the coefficient of variation $B_j$ of the target battery cell.

Among them, the target difference d is the different between the first parameter $\sigma_j$ of the target battery cell and the average $\sigma_{mean}$.

S340: For the target battery cell of the battery pack, it is determined that an internal short-circuit fault occurs in the target battery cell, under a condition that the second parameter is greater than a preset parameter threshold.

In some embodiments, the preset parameter threshold has a positive correlation with the quantity of m battery cells. For ease of description, the following part of the embodiments of the present application will use the coefficient of variation as an example of the second parameter to explain the preset parameter threshold in details.

Table 1 Association between the total number of battery cells and the preset parameter threshold

| Total number of battery cells | <50 | 50-100 | 100-150 | >150 |
|---|---|---|---|---|
| Preset parameter threshold | 4 | 5 | 6 | 10 |

As shown in Table 1 above, the applicant sets the preset parameter threshold stepwise according to battery cell data, based on a large amount of test data and simulation results. If the total number of battery cells in the battery pack is less than 50, the preset parameter threshold may be set to 4. That is to say, if the coefficient of variation $B_j$ of the target battery cell it is greater than 4, it is determined that the target battery cell is a faulty battery cell. If the total number of battery cells in the battery pack is between 50 and 100, the preset parameter threshold may be set to 5. That is to say, if the coefficient of variation $B_j$ of the target battery cell is greater than 5, it is determined that the target battery cell is a faulty battery cell. If the total number of battery cells in the battery pack is between 100 and 150, the preset parameter threshold may be set to 6. That is to say, if the coefficient of variation $B_j$ of the target battery cell is greater than 6, it is determined that the target battery cell is a faulty battery cell. If the total number of battery cells in the battery pack is greater than 150, the preset parameter threshold may be set to 10. That is to say, if the coefficient of variation $B_j$ of the target battery cell is greater than 10, it is determined that the target battery cell is a faulty battery cell.

Figure 5:
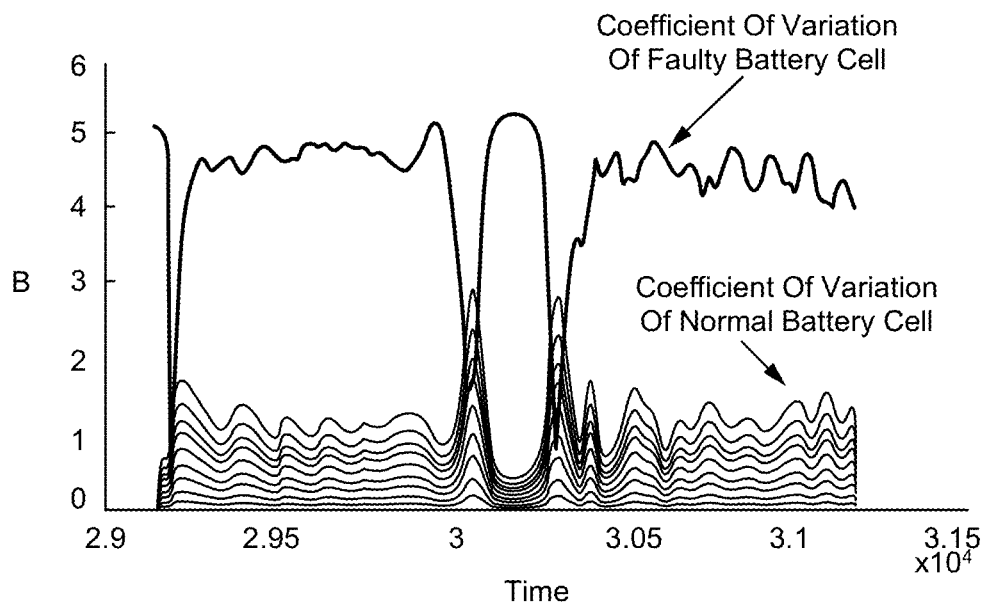
FIG. 5 is an exemplary simulation schematic diagram of a coefficient of variation of battery cells of a battery pack provided by an embodiment of the present application.

Exemplarily, when the quantity of battery cells in the battery pack is 30, an exemplary simulation result of the coefficient of variation of the battery cells of the battery pack in the embodiment of the present application may be shown in FIG. 5. As shown in FIG. 5, the coefficient of variation B of a faulty battery cell fluctuates between 4-6 most of the time, while the coefficient of variation B of a normal battery cell basically does not exceed 2, i.e., the coefficient of variation B of the normal battery cell is fluctuates between 0 and 2.

Figure 6:
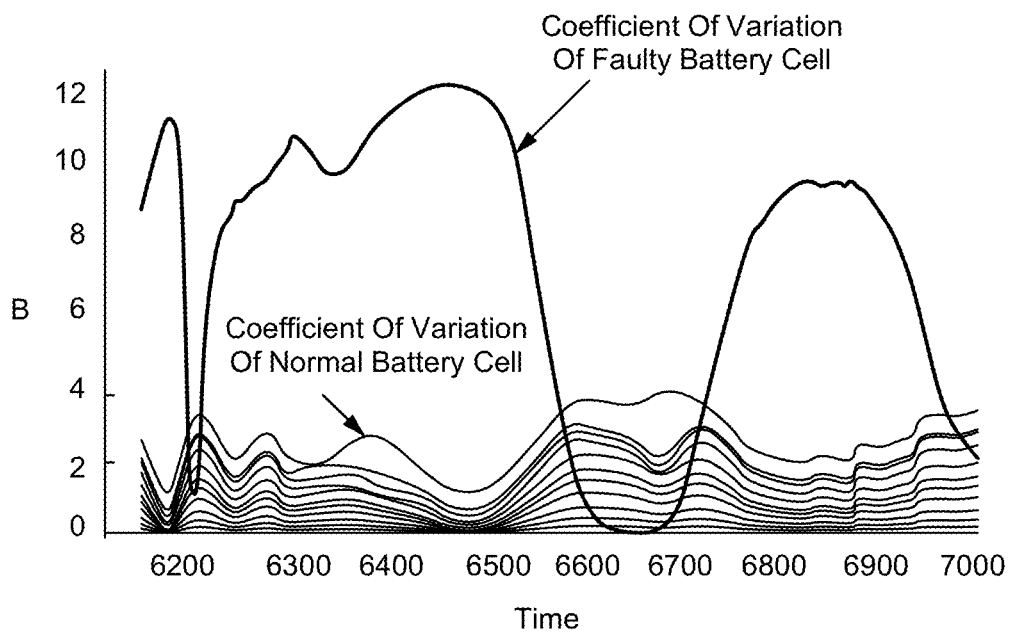
FIG. 6 is another exemplary simulation schematic diagram of a coefficient of variation of battery cells of a battery pack provided by an embodiment of the present application.

In another example, when the quantity of battery cells in the battery pack is 192, an exemplary simulation result of the coefficient of variation of the battery cells of the battery pack in the embodiment of the present application may be shown in FIG. 6. As shown in FIG. 6, the coefficient of variation B of a faulty battery cell fluctuates between 10-12 in most cases, while the maximum value of the coefficient of variation B of a normal battery cell may be slightly greater than 4, i.e., the coefficient of variation B of the normal battery cell fluctuates basically between 0 and 4.

It can be seen from the comparison of FIG. 5 and FIG. 6, that if both the preset parameter threshold under a condition that the quantity of battery cells in the battery pack is 192 and the preset parameter threshold under a condition that the number of battery cells in the battery pack is 30 are 4, when the quantity of the battery cells in the battery pack is great, it may be misdiagnosed that an internal short-circuit fault occurs in a normal battery cell. In addition, if both the preset parameter threshold under a condition that the quantity of battery cells in the battery pack is 192 and the preset parameter threshold under a condition that the number of battery cells in the battery pack is 30 are 10, when the quantity of the battery cells in the battery pack is few, it may be impossible to diagnose a faulty battery cell with an internal short-circuit fault.

According to the method for detecting the internal short-circuit fault of the battery cell in the embodiment of the present application, in the current $n^{th}$ detection process for the internal short-circuit fault of the battery cell under the charging/discharging operating condition, the first parameter can be calculated according to the electrical signal values at the multiple times of the target battery cell. For m battery cells of the same battery pack, a change rate of an electrical signal of a faulty battery cell in which an internal short-circuit fault occurs will differ from a change rate of an electrical signal of a normal battery cell, and correspondingly a degree of fluctuation of the electrical signal of the faulty battery cell will also differ from that of the normal battery cell. Since the first parameter can characterize the degree of fluctuation of the electrical signal, the first parameter of the faulty battery cell is also different from that of the normal battery cell. When there is a faulty battery cell in the m battery cells of the battery pack, the degree of dispersion between the first parameter of the faulty battery cell and the first parameters of other battery cells will be greater than that of a normal battery cell. Therefore, the second parameter characterizing the degree of dispersion between the first parameter of each battery cell and the first parameters of the other battery cells is used. Since the second parameter has a positive correlation with the degree of dispersion, a battery cell in which an internal short-circuit occurs can be detected accurately, when the second parameter of the battery cell is greater than the preset parameter threshold.

Figure 7:
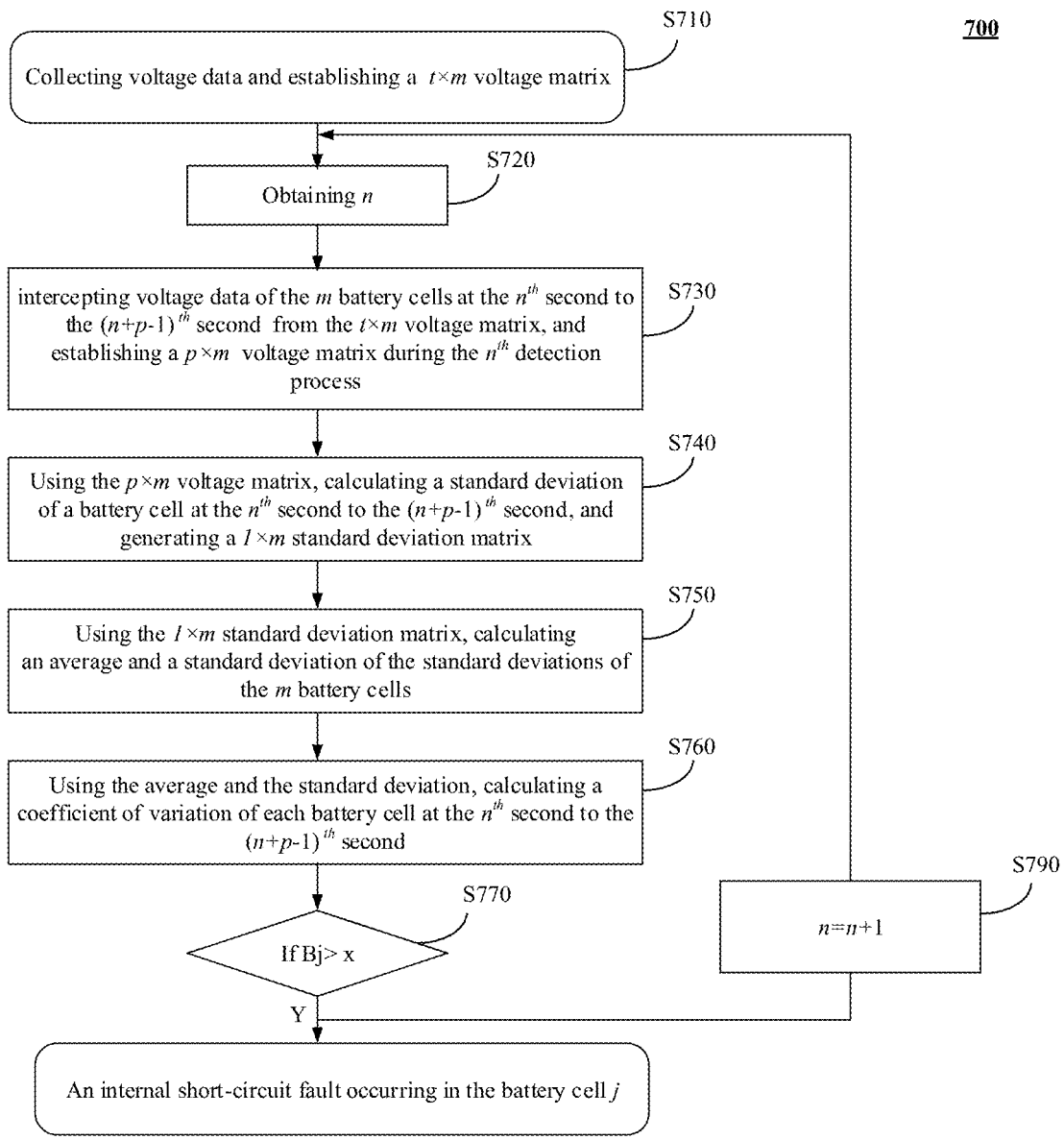
FIG. 7 is a schematic flowchart of an exemplary method for detecting an internal short-circuit fault of a battery cell provided by an embodiment of the present application.

In order to provide better understanding of the present application, FIG. 7 is a schematic flowchart of an exemplary method for detecting an internal short-circuit fault of a battery cell provided by an embodiment of the present application. As shown in FIG. 7, the method 700 for detecting the internal short-circuit fault of the battery cell may include S710 to S790.

S710: Voltage data are collected and a t×m voltage matrix is established. Particularly, when the battery pack is in the process of charging, voltage data of all the m battery cells of the battery pack within a total of t seconds are collected, and the t×m voltage matrix is established according to the voltage data of the m battery cells at the t seconds.

The t×m voltage matrix is specifically expressed as:

$$\begin{pmatrix} V_{1,1} & \cdots & V_{1,m} \\ \vdots & \ddots & \vdots \\ V_{t,1} & \cdots & V_{t,m} \end{pmatrix}$$

The $i^{th}$ row data in the t×m voltage matrix represent voltage data of each of the m battery cells at the $i^{th}$ second, and the $j^{th}$ column data in the voltage matrix represent voltage data the $j^{th}$ battery cell within the t seconds. Exemplarily, t in this embodiment is equal to 96 seconds.

S720: A parameter n is obtained, where an initial value of n is 1.

S730: Voltage data of the m battery cells at the $n^{th}$ second to the $(n+p-1)^{th}$ second are intercepted from the t×m voltage matrix, and a p×m voltage matrix during the $n^{th}$ detection process is established The p×m voltage matrix is specifically expressed as:

$$\begin{pmatrix} V_{n,1} & \cdots & V_{n,m} \\ \vdots & \ddots & \vdots \\ V_{n+p-1,1} & \cdots & V_{n+p-1,m} \end{pmatrix}$$

S740: A standard deviation σ of each battery cell at the $n^{th}$ second to the $(n+p-1)^{th}$ second is calculated using the p×m voltage matrix of the previous step, and a 1×m standard deviation matrix is generated. Particularly, one standard deviation σ may be calculated from p voltage data in each column of the p×m voltage matrix.

The standard deviations of the m battery cells may be expressed as the following 1×m standard deviation matrix:

$(\sigma_{1,1}, \ldots, \sigma_{1,m})$.

For specific content of the standard deviation σ, please refer to the related description of the calculation method of the first parameter in the foregoing embodiment of the present application, which will not be repeated here.

S750: An average $\sigma_{mean}$ and a standard deviation $\sigma_\sigma$ of the standard deviations of the m battery cells are calculated using the 1×m standard deviation matrix of the previous step.

For specific content of the average $\sigma_{mean}$ and the standard deviation $\sigma_\sigma$, please refer to the related description of the average $\sigma_{mean}$ and the target standard deviation $\sigma_\sigma$ in the S330 part of the foregoing embodiment of the present application, which will not be repeated here.

S760: A coefficient of variation of each battery cell at the $n^{th}$ second to the $(n+p-1)^{th}$ second is calculated using the average $\sigma_{mean}$ and the standard deviation $\sigma_\sigma$ calculated in the previous step.

S770: It is determined whether the coefficient of variation $B_j$ of any battery cell j calculated in the previous step is greater than a preset threshold x.

S780: Under a condition that the coefficient of variation of any battery cell $B_j$ is greater than the preset threshold x, it is determined that an internal short-circuit fault has occurred in the battery cell j.

S790: n is updated to n+1, and the process cycles by returning to step S710 until n=t+1−p, i.e., all voltage data have been processed.

Since it takes several hours from occurrence of internal short-circuit in a battery to an eventual thermal runaway, the present application uses the first n seconds since the internal short-circuit begins to occur, for example, the voltage data of the first 96 seconds, to determine whether internal short-circuit fault occurs in a battery cell, and is thus able to identify a faulty battery cell in time in an early stage of the internal short circuit fault, so as to avoid occurrence of the thermal runaway to the greatest extent, and ensure the safety of the battery to the greatest extent.

Figure 8:
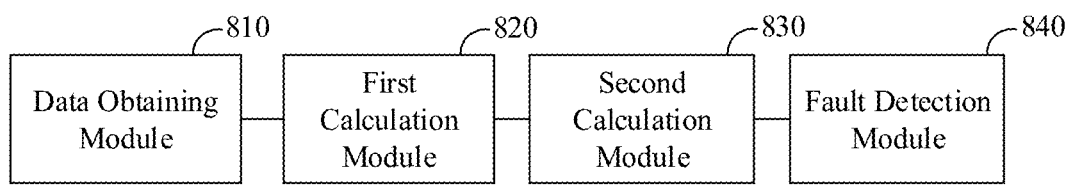
FIG. 8 is a schematic structural diagram of an apparatus for detecting an internal short-circuit fault of a battery cell provided by an embodiment of the present application.

Based on the same application concept, embodiments of the present application provide, in addition to the method for detecting the internal short-circuit fault of the battery cell, a corresponding apparatus for detecting an internal short-circuit fault of a battery cell. The apparatus according to an embodiment of the present application is described in details below with reference to the accompanying drawings. FIG. 8 is a schematic structural diagram of the apparatus for detecting the internal short-circuit fault of the battery cell provided by the embodiment of the present application.

As shown in FIG. 8, the apparatus 800 for detecting the internal short-circuit fault of the battery cell includes a data obtaining module 810, a first calculation module 820, a second calculation module 830 and fault detection module 840.

The data obtaining module 810 is configured to obtain electrical signal values at multiple times for each of m battery cells of a battery pack, when the battery pack is in a preset condition.

The preset condition comprises that a current detection is an $n^{th}$ detection of an internal short-circuit fault of a battery cell, and m and n are positive integers.

The preset condition includes that it is currently in the nth detection process for the internal short-circuit fault of the battery, and m and n are positive integers.

The first calculation module 820 is configured to calculate, for a target battery cell of the battery pack, a first parameter of the target battery cell using the electrical signal values at the multiple times of the target battery cell.

The first parameter is used to characterize a degree of fluctuation of the electrical signal values of the target battery cell.

The second calculation module 830 is configured to calculate, for the target battery cell of the battery pack, a second parameter that characterizes a degree of dispersion between the first parameter of the target battery cell and first parameters of other battery cells.

The second parameter has a positive correlation with the degree of dispersion, and the other cells are battery cells of the m battery cells other than the target battery cell.

The fault detection module 840 is configured to determine, for the target battery cell of the battery pack, that an internal short-circuit fault occurs in the target battery cell, under a condition that the second parameter is greater than a preset parameter threshold.

In some embodiments, when n is an integer greater than 1, the preset condition further includes that the second parameter of the target battery cell is greater than the preset parameter threshold, for each of first n−1 detections of the internal short-circuit fault of the battery cell.

In some embodiments, the preset parameter threshold has a positive correlation with a quantity of the m battery cells.

In some embodiments, the first parameter of the target battery cell is a standard deviation of the electrical signal values at the multiple times of the target battery cell.

In some embodiments, the second parameter is a coefficient of variation.

The second calculation module 830 may specifically include a first calculation unit and a second calculation unit.

The first calculation unit is configured to calculate target standard deviation characterizing a degree of dispersion of first parameters of the m battery cells, and calculate an average of the first parameters of the m battery cells.

The second calculation unit is configured to calculate a ratio of a target difference to the target standard deviation, and determine the ratio as the coefficient of variation of the target battery cell.

The target difference is a difference between the first parameter of the target battery cell and the average.

According to the apparatus for detecting the internal short-circuit fault of the battery cell in the embodiment of the present application, in the current $n^{th}$ detection process for the internal short-circuit fault of the battery cell under the charging/discharging operating condition, the first parameter can be calculated according to the electrical signal values at the multiple times of the target battery cell. Form battery cells of the same battery pack, a change rate of an electrical signal of a faulty battery cell in which an internal short-circuit fault occurs will differ from a change rate of an electrical signal of a normal battery cell, and correspondingly a degree of fluctuation of the electrical signal of the faulty battery cell will also differ from that of the normal battery cell. Since the first parameter can characterize the degree of fluctuation of the electrical signal, the first parameter of the faulty battery cell is also different from that of the normal battery cell. When there is a faulty battery cell in the m battery cells of the battery pack, the degree of dispersion between the first parameter of the faulty battery cell and the first parameters of other battery cells will be greater than that of a normal battery cell. Therefore, the second parameter characterizing the degree of dispersion between the first parameter of each battery cell and the first parameters of the other battery cells is used. Since the second parameter has a positive correlation with the degree of dispersion, a battery cell in which an internal short-circuit occurs can be detected accurately, when the second parameter of the battery cell is greater than the preset parameter threshold.

Other details of the apparatus for detecting the internal short-circuit fault of the battery cell according to the embodiment of the present application are similar as those of the method for detecting the internal short-circuit fault of the battery cell described above in conjunction with the examples shown in FIG. 1 to FIG. 7, and can achieve corresponding technical effects, which will not be repeated here for concision of the description.

Figure 9:
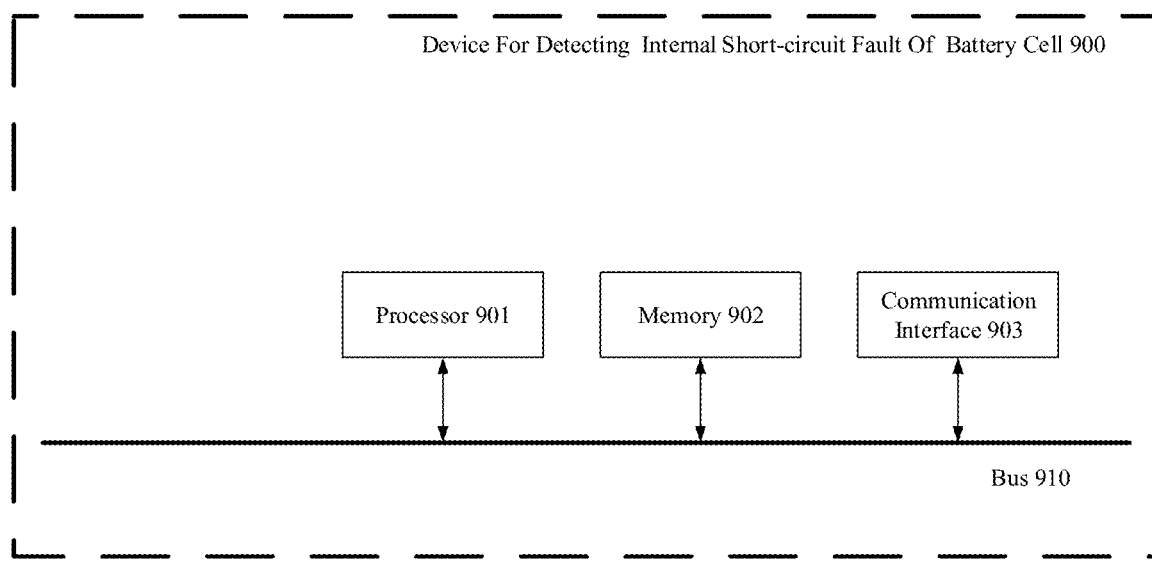
FIG. 9 is a structural diagram of an exemplary hardware architecture of a device for detecting an internal short-circuit fault of a battery cell in an embodiment of the present application.

FIG. 9 shows a schematic hardware structure diagram of a device for detecting an internal short-circuit fault of a battery cell provided by an embodiment of the present application.

The device for detecting the internal short-circuit fault of the battery cell may include a processor 901 and a memory 902 having computer program instructions stored thereon.

Particularly, the above-mentioned processor 901 may include a central processing unit (CPU), or an application specific integrated circuit (ASIC), or one or more integrated circuits that may be configured to implement of the embodiments of the present application.

The memory 902 may include a mass memory for data or instructions. For example but not limitation, the memory 902 may include a hard disk drive (HDD), a floppy disk drive, a flash memory, an optical disk, a magneto-optical disk, a magnetic tape or a universal serial bus (USB) drive, or a combination of two or more of them. In some examples, the memory 902 may include removable or non-removable (or fixed) media, or the memory 902 may be a non-volatile solid-state memory. In some embodiments, the memory 902 may be internal or external to the device for detecting the internal short-circuit fault of the battery cell.

In some examples, the memory 902 may be a read only memory (ROM). In an example, the ROM may be a mask-programmed ROM, a programmable ROM (PROM), an erasable PROM (EPROM), an electrically erasable PROM (EEPROM), an electrically rewritable ROM (EAROM) or flash memory, or a combination of two or more of them.

The memory 902 may include a read-only memory (ROM), a random access memory (RAM), a magnetic disk storage media device, an optical storage media devices, a flash memory device, an electrical, optical, or other physical/tangible memory storage device. Therefore, generally, the memory may include one or more tangible (non-transitory) computer-readable storage media (e.g., memory devices) encoded with software including computer-executable instructions, and when the software is executed (e.g., by one or more processors), it is operable to perform operations described with reference to the method according to an aspect of the present disclosure.

The processor 901 reads and executes the computer program instructions stored in the memory 902, to implement the methods in the embodiments shown in FIG. 1 to FIG. 7, and achieve corresponding technical effects achieved when the methods/steps of the embodiments shown in FIG. 1 to FIG. 7 are executed, which will not be repeated here, for concision of the description.

In an example, the device for detecting the internal short-circuit fault of the battery cell may further include a communication interface 903 and a bus 910. As shown in FIG. 9, the processor 901, the memory 902, and the communication interface 903 are connected and communicate mutually through the bus 910.

The communication interface 903 is mainly used to implement communications between various modules, apparatuses, units and/or devices in the embodiments of the present application.

The bus 910 may include hardware, software, or both, and couple components of an online data flow accounting device to each other. For example but not limitation, the bus may include an accelerated graphics port (AGP) or other graphics bus, an enhanced industry standard architecture (EISA) bus, a front side bus (FSB), a hyper transport (HT) interconnection, an industry standard architecture (ISA) bus, an unlimited bandwidth interconnection, a low pin count (LPC) bus, a memory bus, a microchannel architecture (MCA) bus, a peripheral component interconnection PCI bus, a PCI-Express (PCI-X) bus, a Serial Advanced Technology Attachment (SATA) bus, a Video Electronics Standards Association Local (VLB) bus or other suitable bus or a combination of two or more of them. Where appropriate, the bus 910 may include one or more buses. Although the embodiments of the present application describe and show specific buses, the present application has contemplated any suitable bused or interconnections.

The device for detecting the internal short-circuit fault of the battery cell can execute the method for detecting the internal short-circuit fault of the battery cell in the embodiment of the present application, so as to realize the method and apparatus for detecting the internal short-circuit fault of the battery cell described in conjunction with FIG. 1 to FIG. 8.

In addition, in combination with the method for detecting the internal short-circuit fault of the battery cell in the embodiment of the present application, an embodiment of the present application may provide a computer storage medium to implement the method. The computer storage medium has computer program instructions stored thereon. When the computer program instructions are executed by the processor, any method for detecting the internal short-circuit fault of the battery cell in the aforementioned embodiment can be implemented.

It should be clarify that the present application is not limited to the specific configurations and process described above and shown in the drawings. For the sake of brevity, a detailed description of known methods is omitted here. In the above embodiments, several specific steps are described and shown as examples. However, the method processes of the present application are not limited to the specific steps described and shown, and those skilled in the art can make various changes, modifications and additions, or change the order between the steps after understanding the spirit of the present application.

It should be noted that functional blocks shown in the above-mentioned structural block diagrams may be implemented as hardware, software, firmware, or a combination thereof. When implemented in hardware, they can be, for example, electronic circuits, application specific integrated circuits (ASICs), appropriate firmware, plug-ins, function cards, and so on. When implemented in software, elements of the present application are programs or code segments used to perform required tasks. The programs or code segments may be stored in machine-readable media, or transmitted on transmission media or communication links through data signals carried in carrier waves. "Machine-readable media" may include any media that can store or transmit information. Examples of machine-readable media may include electronic circuits, semiconductor memory devices, ROMs, flash memories, erasable ROMs (EROMs), floppy disks, CD-ROMs, optical disks, hard disks, fiber optic media, radio frequency (RF) links, and so on. The code segments can be downloaded via a computer network such as the Internet, an intranet, etc.

It should also be noted that, the exemplary embodiments described in the present application describe some methods or systems based on a series of steps and apparatuses. However, the present application is not limited to the order of the above steps. That is to say, the steps may be executed in the order described in the embodiments or in an order different from that in the embodiments, or several steps may be executed simultaneously.

Various aspects of the present disclosure are described with reference to the flowcharts and/or block diagrams of the methods, apparatuses, devices, and computer program products according to the embodiments of the present disclosure. It should be understood that each block in the flowcharts and/or block diagrams and combinations of blocks in the flowcharts and/or block diagrams can be implemented by computer program instructions. These computer program instructions can be provided to a processor of a general-purpose computer, a special-purpose computer, or other programmable data processing apparatus, to produce a machine that causes these instructions executed by the processor of the computer or other programmable data processing apparatus to enable the implementation of the functions/actions specified in one or more blocks of the flowcharts and/or block diagrams. Such processor may be, but is not limited to, a general-purpose processor, a dedicated processor, a special application processor, or a field programmable logic circuit. It can also be understood that each block in the block diagrams and/or flowcharts and a combination of the blocks in the block diagrams and/or flowcharts may be implemented by dedicated hardware that performs specified functions or actions, or may be implemented by a combination of the dedicated hardware and the computer instructions.

The above embodiments are only specific implementations of the present application. Those skilled in the art can clearly understand that, for convenience and conciseness of the description, specific working processes of the above-described systems, modules and units may refer to corresponding processes in the foregoing method embodiments, which will not be repeated here. It should be understood that the protection scope of the present application is not limited to this. Any person skilled in the art can easily conceive of equivalent changes or substitutions within the technical scope disclosed in the present application, which should be covered within the protection scope of the present application.

What is claimed is:

1. A method for detecting an internal short-circuit fault of a battery cell, comprising:
    measuring, by an electrical signal measuring apparatus, electrical signal values at multiple times for each of m battery cells of a battery pack, when the battery pack is in a preset condition, wherein the preset condition comprises that a current detection is an $n^{th}$ detection of an internal short-circuit fault of a battery cell under any one of a charging operating condition, a discharging operating condition, or a static operating condition, and m and n are positive integers; and
    performing following steps, by a processing apparatus, for a target battery cell of the battery pack:
        calculating a first parameter of the target battery cell using the electrical signal values at the multiple times of the target battery cell, wherein the first parameter is used to characterize a degree of fluctuation of the electrical signal values of the target battery cell;
        calculating a second parameter that characterizes a degree of dispersion between the first parameter of the target battery cell and first parameters of other battery cells, wherein the other cells are battery cells of the m battery cells other than the target battery cell, and the second parameter has a positive correlation with the degree of dispersion; and
        determining that an internal short-circuit fault occurs in the target battery cell, under a condition that the second parameter is greater than a preset parameter threshold.

2. The method for detecting the internal short-circuit fault of the battery cell of claim 1, wherein when n is an integer greater than 1, the preset condition further comprises:
    the second parameter of the target battery cell being greater than the preset parameter threshold, for each of first n−1 detections of the internal short-circuit fault of the battery cell.

3. The method for detecting the internal short-circuit fault of the battery cell of claim 1, wherein the preset parameter threshold has a positive correlation with a quantity of the m battery cells.

4. The method for detecting the internal short-circuit fault of the battery cell of claim 1, wherein the first parameter of the target battery cell is a standard deviation of the electrical signal values at the multiple times of the target battery cell.

5. The method for detecting the internal short-circuit fault of the battery cell of claim 1, wherein the second parameter is a coefficient of variation, calculating the second parameter that characterizes the degree of dispersion between the first parameter of the target battery cell and the first parameter of other battery cells comprises:

calculating a target standard deviation characterizing a degree of dispersion of first parameters of the m battery cells, and calculating an average of the first parameters of the m battery cells; and calculating a ratio of a target difference to the target standard deviation, and determining the ratio as the coefficient of variation of the target battery cell, wherein the target difference is a difference between the first parameter of the target battery cell and the average.

6. A device for detecting an internal short-circuit fault of a battery cell, comprising:

a memory, configured to store programs; and a processor, configured to execute the programs stored in the memory to:

obtain electrical signal values measured by an electrical signal measuring apparatus at multiple times for each of m battery cells of a battery pack, when the battery pack is in a preset condition, wherein the preset condition comprises that a current detection is an $n^{th}$ detection of an internal short-circuit fault of a battery cell under any one of a charging operating condition, a discharging operating condition, or a static operating condition, and m and n are positive integers; and perform following steps for a target battery cell of the battery pack:

calculating a first parameter of the target battery cell using the electrical signal values at the multiple times of the target battery cell, wherein the first parameter is used to characterize a degree of fluctuation of the electrical signal values of the target battery cell;

calculating a second parameter that characterizes a degree of dispersion between the first parameter of the target battery cell and first parameters of other battery cells, wherein the other cells are battery cells of the m battery cells other than the target battery cell, and the second parameter has a positive correlation with the degree of dispersion; and determining that an internal short-circuit fault occurs in the target battery cell, under a condition that the second parameter is greater than a preset parameter threshold.

7. The device for detecting the internal short-circuit fault of the battery cell of claim 6, wherein when n is an integer greater than 1, the preset condition further comprises:

the second parameter of the target battery cell being greater than the preset parameter threshold, for each of first n−1 detections of the internal short-circuit fault of the battery cell.

8. The device for detecting the internal short-circuit fault of the battery cell of claim 6, wherein the preset parameter threshold has a positive correlation with a quantity of the m battery cells.

9. The device for detecting the internal short-circuit fault of the battery cell of claim 6, wherein the first parameter of the target battery cell is a standard deviation of the electrical signal values at the multiple times of the target battery cell.

10. The device for detecting the internal short-circuit fault of the battery cell of claim 6, wherein the second parameter is a coefficient of variation, calculating the second parameter that characterizes the degree of dispersion between the first parameter of the target battery cell and the first parameter of other battery cells comprises:

calculating a target standard deviation characterizing a degree of dispersion of first parameters of the m battery cells, and calculating an average of the first parameters of the m battery cells; and calculating a ratio of a target difference to the target standard deviation, and determining the ratio as the coefficient of variation of the target battery cell, wherein the target difference is a difference between the first parameter of the target battery cell and the average.

11. A computer storage medium having computer program instructions stored thereon, which when executed by a processor, cause the processor to:

obtain electrical signal values measured by an electrical signal measuring apparatus at multiple times for each of m battery cells of a battery pack, when the battery pack is in a preset condition, wherein the preset condition comprises that a current detection is an $n^{th}$ detection of an internal short-circuit fault of a battery cell under any one of a charging operating condition, a discharging operating condition, or a static operating condition, and m and n are positive integers; and perform following steps for a target battery cell of the battery pack:

calculating a first parameter of the target battery cell using the electrical signal values at the multiple times of the target battery cell, wherein the first parameter is used to characterize a degree of fluctuation of the electrical signal values of the target battery cell;

calculating a second parameter that characterizes a degree of dispersion between the first parameter of the target battery cell and first parameters of other battery cells, wherein the other cells are battery cells of the m battery cells other than the target battery cell, and the second parameter has a positive correlation with the degree of dispersion; and determining that an internal short-circuit fault occurs in the target battery cell, under a condition that the second parameter is greater than a preset parameter threshold.

12. The computer storage medium of claim 11, wherein when n is an integer greater than 1, the preset condition further comprises:

the second parameter of the target battery cell being greater than the preset parameter threshold, for each of first n−1 detections of the internal short-circuit fault of the battery cell.

13. The computer storage medium of the battery cell of claim 11, wherein the preset parameter threshold has a positive correlation with a quantity of the m battery cells.

14. The computer storage medium of claim 11, wherein the first parameter of the target battery cell is a standard deviation of the electrical signal values at the multiple times of the target battery cell.

15. The computer storage medium of claim 11, wherein the second parameter is a coefficient of variation, calculating the second parameter that characterizes the degree of dispersion between the first parameter of the target battery cell and the first parameter of other battery cells comprises:

calculating a target standard deviation characterizing a degree of dispersion of first parameters of the m battery cells, and calculating an average of the first parameters of the m battery cells; and calculating a ratio of a target difference to the target standard deviation, and determining the ratio as the coefficient of variation of the target battery cell, wherein the target difference is a difference between the first parameter of the target battery cell and the average.

\* \* \* \* \*